US 6,759,121 B2
Jul. 6, 2004

(54) CLEAR ADHESIVE SHEET

(75) Inventors: Karunasena A. Alahapperuma, Austin, TX (US); Peter A. Stark, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 99 days.

(21) Appl. No.: 10/015,006

(22) Filed: Dec. 11, 2001

(65) Prior Publication Data

US 2003/0108738 A1 Jun. 12, 2003

Related U.S. Application Data

(63) Continuation-in-part of application No. 09/615,389, filed on Jul. 13, 2000, now Pat. No. 6,472,065.

(51) Int. Cl.[7] .................. B32B 7/12; H01L 21/302
(52) U.S. Cl. .................. 428/355 AC; 428/343; 428/345; 428/355 N; 428/901; 522/95; 522/96
(58) Field of Search .................. 428/355 AC, 355 N, 428/343, 345, 901; 522/95, 96

(56) References Cited

U.S. PATENT DOCUMENTS

| | | | | |
|---|---|---|---|---|
| RE24,906 E | * | 12/1960 | Ulrich | 428/343 |
| 4,756,968 A | | 7/1988 | Ebe et al. | 428/343 |
| 4,999,242 A | | 3/1991 | Ishiwata et al. | 428/385 |
| 5,281,473 A | * | 1/1994 | Ishiwata et al. | 428/345 |
| 5,480,842 A | | 1/1996 | Clifton et al. | 437/226 |
| 5,907,023 A | | 5/1999 | Chawla | 428/49 |
| 6,013,722 A | | 1/2000 | Yang et al. | 524/558 |
| 6,039,830 A | | 3/2000 | Park et al. | 156/267 |
| 6,297,076 B1 | * | 10/2001 | Amagai et al. | 438/114 |
| 6,312,800 B1 | | 11/2001 | Noguchi et al. | |
| 6,472,065 B1 | * | 10/2002 | Alahapperuma et al. | 428/343 |
| 2001/0019766 A1 | | 9/2001 | Masuda et al. | |

FOREIGN PATENT DOCUMENTS

| | | | |
|---|---|---|---|
| DE | 43 16 317 A1 | 11/1994 | |
| EP | 0 298 448 | 1/1989 | C09J/7/02 |
| EP | 0 622 833 A1 | 2/1994 | H01L/21/302 |
| EP | 0 628 616 A1 | 12/1994 | |
| EP | 0 976 802 A1 | 2/2000 | C09J/7/02 |
| EP | 0 981 156 A2 | 2/2000 | |
| EP | 0 999 250 A2 | 5/2000 | |
| JP | XP 002164356 | 7/1984 | |
| JP | 07-045557 | 2/1995 | |

OTHER PUBLICATIONS

Product Literature: Photoinitiators for UV Curing, Key Products Selection Guide, Ciba Specialty Chemicals, Publication #A–8055M49, pp. 1–8, 1999.

* cited by examiner

Primary Examiner—Daniel Zirker

(57) ABSTRACT

A radiation detackifiable adhesive composition comprising a (meth)acrylate copolymer including from 85 wt. % to 97.5 wt. % of a (meth)acrylate ester and from 2.5 wt. % to 15 wt. % of a copolymerizable carboxylate monomer and a multi-functional urethane acrylate oligomer combined with the (meth)acrylate copolymer to provide from 25 parts to 40 parts of the oligomer per 100 parts of the copolymer. The adhesive composition becomes progressively detackified during exposure to ultraviolet radiation. Properties of adhesive compositions may be maintained at elevated temperatures, from about 115° C. to about 155° C., when they include a thermally stable free radical initiator to overcome premature adhesive detackification.

The present invention further provides a clear adhesive coated sheet for supporting a silicon wafer during manufacture of semiconductor microchips. The coated sheet comprises a transparent film substrate coated with a radiation detackifiable adhesive composition.

16 Claims, No Drawings

CLEAR ADHESIVE SHEET

This application is a continuation-in-part of application Ser. No. 09/615,389, filed on Jul. 13, 2000, now U.S. Pat. No. 6,472,065 B1.

FIELD OF THE INVENTION

The invention relates to adhesive coated sheets used during fabrication of electronic devices and more particularly to adhesive coatings having a low level of haze and reduced levels of tack after exposure to suitable radiation.

BACKGROUND OF THE INVENTION

The production of semiconductor dies, approximately 100 $\mu$m to 175 $\mu$m thick, requires a sequence of process steps for converting a silicon wafer into relatively tiny integrated circuit chips. Conventional processing of silicon wafers uses adhesive coated sheet material during grinding of full-thickness wafers to a target overall thickness, and while dicing a wafer into individual semiconductor dies.

Wafer dicing requires delicate control of equipment since the dicing process is one of the most aggressive operations in silicon wafer manufacture. Individual wafers acquire a great deal of value during processing before wafer dicing and any damage occurring at this stage is very costly in terms of die scrapped and production costs associated with die replacement. Dicing techniques and processes can introduce chipping into both the front and backside edges of the die due to such factors as blade loading, depth of the cut, feed rates, blade width, coolant, blade orientation with reference to the crystal lattice, tape adhesion, and die rotation.

The use of radiation-curable adhesive sheets offers several advantages over non-curing types of adhesive sheet material. Ultraviolet (UV) wafer dicing tape, for example, provides the benefit of high holding power during dicing, which serves to reduce die rotation. Die rotation is one cause of chipping of semiconductor dies. The high holding power of the UV wafer dicing tape thus reduces damage to individual dies. Damage to dies may be further reduced, after dicing, by exposing adhesive to UV radiation to greatly lower tape adhesion. Lowering of tape adhesion, i.e. level of tack, reduces the strength of the bond between the exposed adhesive and the back of the processed wafer. This lessens ejector pin scratches, chipping and other forms of die damage by reducing the force necessary to eject or remove a die from the surface of an adhesive tape.

U.S. Pat. No. 5,480,842 refers to the use of UV adhesive tapes during wafer grinding and wafer dicing operations of semiconductor die fabrication. No compositional information is provided for the UV sensitive adhesive. Another U.S. Pat. No. 6,039,830 describes the use of an UV tape comprising a base film of polyolefin coated on one side with an acrylate-containing adhesive having a photoinitiator. This limited information only places the adhesive material within the general category of acrylate adhesives that includes a wide variety of compositions differing in properties. The description of a radiation curable adhesive tape, in U.S. Pat. No. 4,999,242, provides evidence of the use of copolymers including acrylate ester monomers, and acrylic acid. Copolymers formed from these monomers may be mixed with urethane acrylate oligomers to provide adhesive formulations that lose adhesion during exposure to ultraviolet radiation. There is no indication of the actual proportions of monomers used to produce the acrylate copolymers, and thus no evidence of property changes, such as transparency of the adhesives, due to change in proportions of selected monomers. U.S. Pat. No. 4,756,968 uses an adhesive layer consisting of an adhesive and a radiation polymerizable compound. The radiation polymerizable compound is a urethane acrylate oligomer having a molecular weight of 3,000–10,000. This oligomer may be used with an equal amount of acrylate copolymer adhesive to provide a radiation sensitive composition in the presence of a benzophenone type of free radical initiator. Upon irradiation with a suitable form of radiant energy, the adhesion level of the adhesive decreases. This property has value for wafer dicing processes, as previously discussed.

A material that changes color during radiation may be added to curing adhesive compositions, described in U.S. Pat. No. 4,756,968, to facilitate detection and picking of diced dies by automatic equipment. In the absence of color change, the photosensor loses discriminatory power causing errors in the automatic picking of separated dies. Automated equipment processes for fabricating semiconductor dies include steps for inspecting silicon wafers at various stages of manufacture. Inspection equipment will, at times, be required to assess the condition of a wafer covered and protected by an adhesive sheet. A highly transparent sheet will reduce die sensing and die picking errors and facilitate inspection of a wafer for grinding and sawing damage. Transparency of adhesives and adhesive sheets, which is important to wafer processing, may be altered during exposure of an adhesive to radiation. The radiation produces a curing reaction and adhesive polymerization with haze development that reduces sheet transparency.

U.S. Pat. No. 6,013,722 describes water resistant, low haze acrylic emulsion pressure sensitive adhesive compositions. Although apparently resistant to one-time application of water, during lamination, there is no evidence to show that the low haze emulsion adhesives described as "water resistant," could withstand repeated water impingement from the high-pressure water jets used during wafer dicing. It is known that, in contact with water, emulsion polymers typically exhibit haze characteristics described as "cloudy," "milky," and "white."

A low haze radiation curable coating, described in U.S. Pat. No. 5,907,023, comprises a urethane oligomer, including urethane acrylates, as a primary ingredient of a radiation polymerizable liquid composition. Visual determination of haze shows that lowering the proportion of urethane oligomer, in the curable compositions, produces more haze. The observed increase in haze may result, for example, from incompatibility among formulation components.

Significant reduction or substantial elimination of haze would be advantageous to allow better inspection of wafers during processing. Improvement towards this objective could lead to greater effectiveness and efficiency of automated semiconductor die manufacture, thereby reducing cost.

SUMMARY OF THE INVENTION

The present invention provides adhesive compositions suitable for coating on transparent substrates to provide adhesive sheets exhibiting relatively high initial adhesion and low haze. Exposure to suitable radiation induces curing of clear adhesive sheets, according to the present invention, to a condition having adhesion values significantly lower than an uncured adhesive. Reduction of adhesion, also referred to herein as adhesive detackification, proceeds without significant change in sheet transparency. Adhesion reduction without increase in haze favors the use of clear adhesive sheets according to the present invention in automated processes, during semiconductor die manufacture, and particularly during inspection of diced wafers for cracks and chipping.

High initial adhesion of UV detackifiable wafer-dicing adhesive sheets, according to the present invention, facilitates dicing without wafer edge damage or die losses. Controlled lowering of adhesion also facilitates die removal or pick from the adhesive coating by lowering the force required to remove individual dies. The use of clear tape allows inspection of die edges before picking. Die inspection, whether visual or machine automated, identifies damaged dies for rejection to avoid defective die failures in subsequent operations.

Adhesive compositions according to the present invention provide wafer-dicing tapes having greatly improved clarity and initial adhesion levels sufficiently high for effective bonding to silicon wafers. A process of adhesive detackification uses ultraviolet radiation to crosslink an adhesive composition, to lower the level of adhesion or tack and thereby allows low force, clean removal of individual dies produced during the diamond sawing, and wafer dicing operation.

More particularly the present invention provides a radiation detackifiable adhesive composition comprising a (meth) acrylate copolymer including from 85 wt. % to 97.5 wt. % of a (meth)acrylate ester and from 2.5 wt. % to 15 wt. % of a copolymerizable carboxylate monomer and a multifunctional urethane acrylate oligomer combined with the (meth)acrylate copolymer to provide from 25 parts to 40 parts of the oligomer per 100 parts of the copolymer. The adhesive composition becomes progressively detackified during exposure to ultraviolet radiation. Preferably the (meth)acrylate copolymer consists essentially of from 90 wt % to 97.5 wt % of n-butyl acrylate and from 2.5 wt % to 10 wt % of acrylic acid.

The present invention further provides a clear adhesive coated sheet for supporting a silicon wafer during manufacture of semiconductor microchips. The coated sheet comprises a transparent film substrate; and a radiation detackifiable adhesive composition coated on a surface of the transparent substrate. The adhesive composition comprises a (meth)acrylate copolymer including from 85 wt. % to 97.5 wt. % of a (meth)acrylate ester and from 2.5 wt. % to 15 wt. % of a copolymerizable carboxylate monomer and a multifunctional urethane acrylate oligomer combined with the (meth)acrylate copolymer to provide from 25 parts to 40 parts of the oligomer per 100 parts of the copolymer. The adhesive sheet preferably has an initial 180° peel adhesion from silicon from 200 g/25 mm to 1,000 g/25 mm. The 180° peel adhesion falls to between 5 g/25 mm to 50 g/25 mm after exposure of the coated sheet to approximately 300 mJ/cm$^2$ radiation from a medium pressure mercury arc lamp. Also the coated sheet has a haze level of less than 8, before and after exposure to radiation, as measured using a BYK Gardner HAZEGARD XL-211 tester.

The properties of adhesive compositions and clear adhesive coated sheets may be maintained at elevated temperatures, from about 115° C. to about 155° C., when they include a thermally stable free radical initiator such as 1-benzoylcyclohexanol. Thermal stability overcomes the potential for generation of free radicals during heating that could cause premature adhesive detackification.

Definition of Terms

The term "haze" refers to reduction in clarity due to scattering of light as by particles or droplets dispersed in a medium. The particles may be too small to be seen but they diminish visibility (ASTM-D1003). Particle or droplet formation may occur by separation of immiscible or otherwise incompatible phases within e.g. a reactive medium represented by a radiation sensitive adhesive coating.

As used herein the terms "transparency" or "transmittance" may be considered complimentary to the term "haze." With increasing haze, there is a reduction in the transparency of adhesive sheets of the present invention or light transmittance through the sheets is diminished.

"Transmittance" of radiant energy refers to the passage of radiant energy through a material.

"Transparency" may be considered as a degree of regular transmission, and thus the property of a material by which objects may be seen clearly through a sheet thereof. A transparent material transmits light without diffusion or scattering.

The term "inherent viscosity" is described by the following equation wherein $\eta_{solvent}$ is the viscosity of the solvent, $\eta_{soln}$ is the viscosity of the solution and C is the solute concentration in terms of gm/deciliter or gm/100 mls which terms are equivalent:

Inherent viscosity $(I.V.) = 1n.\eta_r/C$ $\eta_r = \eta_{soln}/\eta_{solvent}$

Use of the terms "detackification" or "detackifiable" refers to the downward change in adhesion occurring by exposure of adhesive sheets of the present invention to selected radiation, usually ultraviolet (UV) radiation. The downward change during exposure produces less tacky adhesives.

A multifunctional "urethane acrylate oligomer," optionally replaced herein by the term "acrylated urethane oligomer," refers to a material having multiple acrylate groups for rapid curing and development of very high-density crosslink network formation during exposure to suitable radiation in the presence of an initiator. The three basic components of a urethane acrylate oligomer include an isocyanate, an acrylate capping agent and a polyol backbone.

The term "adhesion to silicon" identifies silicon as the test surface used to determine 180° peel values for adhesive coated sheets according to the present invention.

The term "(meth)acrylate," used herein refers to either acrylate or methacrylate moieties.

The term "clean removal" refers to substantial elimination of adhesive contamination on the backside of micro-chips removed or picked from detackified adhesive coated sheets after dicing of silicon wafers into individual dies using diamond coated blades. Contamination may be revealed by differences in contact angle for clean silicon surfaces compared to silicon surfaces after contact with adhesive material. Contact angle differences of more than a few degrees suggest silicon surface contamination by adhesive residues.

DETAILED DESCRIPTION OF THE INVENTION

Adhesive sheets, according to the present invention, comprise a flexible polymer film substrate coated with a pressure sensitive adhesive composition. Such adhesive sheets may be used for protection of silicon wafers during dicing into semiconductor dies.

Adhesive compositions suitable for clear adhesive sheets and wafer dicing tape, according to the present invention, comprise acrylate copolymers having a molecular weight of at least 200,000 mixed with multifunctional acrylate oligomers. The oligomers provide the initial tack levels which are lowered by exposure of the adhesive compositions to suitable radiation. Adhesive compositions may be applied, using conventional methods of coating, preferably transfer-coating, to transparent backings to produce the clear adhesive coated sheets of the present invention. While not wishing to be bound by theory, it is believed that improvement of the miscibility of the components enhances compositional uniformity and morphological stability of the adhesive to minimize phase separation of adhesive reaction products before and after exposure to crosslinking radiation. In this invention the miscibility of acrylate copolymers and urethane acrylate oligomers was improved by adjustment of the amount of an acid monomer comprising an acrylate polymer having an inherent viscosity of from 1.5 to 1.6 corresponding to a relatively high molecular weight of about 400,000. This produced a clear (low haze) adhesive for use with highly transparent substrate materials to yield wafer dicing tapes that may be detackified during exposure to ultraviolet radiation.

Desirable properties for substrate polymer films include, dimensional stability, i.e. substantial uniformity of stress/strain in both machine and cross directions, puncture resistance, and transparency with high clarity. Haze property measurement for such film yields low numbers. Substrates for coating with adhesive compositions according to the present invention may be any material conventionally used as a tape backing, optical film or any other flexible material including single layer, multilayer, and multiaxially oriented films. Suitable film substrates include copolymers of ethylene with α-olefin monomers such as octene and hexene, ethylene vinyl acetate copolymers, ethylene methyl acrylate copolymers, and films of SURLYN polymers that are available from du Pont de Nemours and Company. SURLYN is an ionomer formed from copolymers of ethylene and a salt of (meth)acrylic acid. Materials of this type are preferably dimensionally stable and tough films having a thickness from 50 $\mu$m to 125 $\mu$m.

Low haze numbers are characteristic of materials that may be placed over a surface without significantly obscuring the surface. If the surface is a side of a silicon wafer, protected by adhesive tape, the wafer remains readily visible for inspection as needed during processing. Inspection, whether manual or automated, will detect the existence or condition of wafer defects such as cracks or backside chipping, before or after sawing the wafer into semiconductor dies.

Adhesive compositions according to the present invention are preferably radiation sensitive formulations having high adhesion initially and significantly lower adhesion following exposure to suitable radiation. Selected compositions retain required levels of adhesion during processing at elevated temperatures between about 115° C. and about 155° C. Such processing, e.g. for over-molding of wafers electronic chip testing and related operations, followed by exposure to ultraviolet radiation, facilitates release of devices from the detackified adhesive. In combination with transparent film substrates, previously discussed, radiation sensitive adhesive formulations also contribute to the overall transparency of adhesive coated film sheets. Sheets coated with adhesive compositions according to the present invention, therefore, possess high initial adhesion that diminishes with exposure to suitable radiation. Also the adhesive coated sheets are substantially transparent due to the use of clear adhesive compositions preferably based upon acrylate polymers. High initial 180° peel adhesion of between 200 g/25 mm and 1000 g/25 mm for adhesive sheets according to the present invention produces a relatively strong bond between a sheet and a silicon wafer to which the sheet may be applied. Bond strength is important for supporting the wafer during dicing and also for preventing movement of the semiconductor dies formed during the dicing operation.

Film and adhesive clarity allows the surface of a covered wafer to be clearly viewed through the film and inspected for defects at various stages during processing of silicon wafers. Such defects include cracks in the silicon and chipping at points of contact between the wafer and the dicing saw blade. Haze values, measured for adhesive coated film sheets, preferably fall in a range below 5.0 when measured using a BYK-Gardner HAZEGARD XL-211 haze measuring system. Light transmittance of the coated sheets, although a less reliable indicator than haze, preferably registers values greater than 92% measured using the same equipment. These properties of sheets according to the present invention show significant improvement compared with wafer dicing tape, available from Lintec Corporation, that exhibits initial haze of about 25 rising to about 45 after exposure to ultraviolet radiation.

Adhesive sheets remain transparent during the dicing operation which involves impingement of high-pressure jets of water to cool the high-speed saw blade. While cutting through a silicon wafer, the saw blade generates particulate debris that requires flushing from the cutting area by the water. It will be appreciated that any adverse reaction between an adhesive sheet according to the present invention and water could affect the clarity of the sheet and impair observation and inspection through the sheet. In addition to meeting requirements for initial adhesion, radiation sensitivity, and clarity, adhesive sheets used for wafer dicing should be water resistant to aid visual or machine inspection during silicon wafer processing.

Adhesive products for wafer dicing are currently available commercially in the form of rolls of tape. Tape width is generally sized to the diameter of wafers currently used for manufacturing semiconductor dies. A length of tape, drawn from a roll of tape, provides a sheet of suitable size to cover and support a silicon wafer during dicing. Commercially available wafer dicing tapes, currently used in the fabrication of semiconductor dies, seldom possess an ideal balance of properties such as adhesion, radiation sensitivity, and clarity required of wafer dicing adhesive sheets. In some cases radiation has no effect on an adhesive tape. Formulation of adhesives for such adhesive tapes requires a compromise in adhesion between a high initial adhesion and a lower adhesion preferred for die removal. Die removal may also be referred to herein as die picking. Tapes that lose adhesion following exposure to suitable radiation may be dimensionally unstable. This could lead to problems with film recovery after processing steps that stretch the film, for example to release the dies for die picking.

Despite efforts to improve the properties of adhesive sheets, the ability to meet desired levels of adhesive sheet transparency for wafer dicing operations has remained an elusive goal. Acrylate polymers typically provide clear cast sheets or coatings that satisfy a variety of applications, e.g. optical fiber coatings. Adhesive compositions based upon acrylate polymers, including emulsion, solution and 100% solids adhesives, find use in a variety of applications wherein transparency is a consideration. It is not known if compositions of this type can be adapted for low haze retention while surviving aggressive conditions, including the high pressure water spray used during wafer dicing.

The search for improved transparency according to the present invention revealed adhesive compositions involving acrylate polymers with careful selection of proportions of monomeric species. When coated on substrates of suitable clarity these adhesive compositions produce adhesive sheets having haze levels characteristic of highly transparent films. Adhesion levels associated with these adhesive compositions may be lowered in a controlled manner by exposure to ultraviolet (UV) radiation. Also preferred adhesive compositions, according to the present invention, substantially maintain original levels of transparency after use for wafer dicing.

Adhesive compositions suitable for clear adhesive sheets and wafer dicing tape, according to the present invention, comprise homopolymers of (meth)acrylate ester monomers and copolymers of such esters with (meth)acrylic acid monomers. (Meth)acrylate ester monomers include monofunctional acrylate or methacrylate esters of non-tertiary alkyl alcohols, and mixtures thereof. Preferred monomers include methyl acrylate, ethyl acrylate, propyl acrylate, n-butyl acrylate, isobutyl acrylate, 2-methylbutyl acrylate, 2-ethylhexyl acrylate, 2-ethylhexyl methacrylate, n-octyl acrylate, n-octyl methacrylate, isooctyl acrylate, isooctyl methacrylate, isononyl acrylate, isodecyl acrylate, isobornyl acrylate, isobornyl methacrylate, vinyl acetate, and mixtures thereof. (Meth)acrylic acid monomers include acrylic acid, methacrylic acid, beta-carboxyethyl acrylate, itaconic acid, crotonic acid, fumaric acid, and the like incorporated into a copolymer at an acidic monomer concentration of from 2.5 to 15 weight percent.

The properties of (meth)acrylate ester/(meth)acrylic acid copolymers vary as a result of mixing them e.g. with multifunctional urethane acrylate oligomers. A versatile array of acrylated urethane oligomers exists to satisfy a broad range of applications. Properties of these materials may be varied depending upon selection of the type of isocyanate, the type of polyol modifier, the reactive functionality and molecular weight. Diisocyanates are widely used in urethane acrylate synthesis and can be divided into aromatic and aliphatic diisocyanates. Aromatic diisocyanates are used for manufacture of aromatic urethane acrylates which have significantly lower cost than aliphatic urethane acrylates but tend to noticeably yellow on white or light colored substrates. Aliphatic urethane acrylates include aliphatic diisocyanates that exhibit slightly more flexibility than aromatic urethane acrylates that include the same functionality, a similar polyol modifier and at similar molecular weight. Preferred urethane acrylates include reactive, multifunctional oligomers such as a hexafunctional aromatic urethane acrylate available as CN-975 (M. Wt. is approx. 800) from Sartomer Company of Exton, Pa., and EBECRYL resins available from UCB, Belgium and including EBECRYL 220 (M. Wt. is approx. 1000), a prepolymer based upon acrylic acid, an aliphatic unsaturated polyester and an aromatic isocyanate, and EBECRYL 8301 (M.Wt. is approx. 1000), a hexafunctional aliphatic urethane acrylate containing an acrylated polyol diluent.

Miscibility of components is important to prevent phase separation that causes haze. Interaction between the acrylate polymer and the acrylated urethane oligomer, to improve physical or chemical compatibility should increase light transmittance and lower the haze of a composition.

Adhesive component miscibility may also affect adhesive transfer to the surface, i.e. backside, of a die held to a wafer-dicing sheet by adhesives according to the present invention. After conversion of a silicon wafer into multiple dies it is preferred that removal of the semiconductor chips, during die picking, does not include adhesive contamination of the backside of a chip. Backside contamination may be revealed by measuring the water contact angle relative to the silicon surface before and after wafer dicing. The water contact angle for a clean silicon surface usually measures less than 5°. Contact angle values increase due to material deposition and resultant contamination of a surface. Radiation sensitive adhesive compositions according to the present invention provide substantially non-contaminating wafer dicing sheets. Contact angle measurement with these sheets, after die picking, suggests only a few degrees change from water contact angles relative to a clean silicon surface. Preferred adhesive compositions exhibit water contact angles of less than 15°, and most preferably less than about 10° after die picking. Lack of change in water contact angle and maintenance of low haze characteristics suggests continuing compatibility of phases containing acrylate polymer species and urethane acrylate species, before and after exposure to ultraviolet radiation. Expected structural changes within the adhesive, due to exposure to radiation, do not appear to cause any phase separation that is detectable either by haze or contact angle variation.

The haze values of compositions according to the present invention increase as the reactive urethane acrylate oligomer level increases. This indicates that above a certain concentration the urethane acrylate becomes less compatible with the acrylate copolymer. Increase in haze after exposure of adhesive compositions to UV radiation indicates phase separation during urethane acrylate homopolymer formation. Preferably UV sensitive adhesive compositions according to the present invention contain less than 35 parts of acrylated urethane per hundred parts of (meth)acrylate copolymer. This level of urethane acrylate is lower than for UV crosslinkable compositions reported in U.S. Pat. No. 5,907,023 which include those exhibiting higher haze corresponding to replacement of a curable urethane acrylate as the major component.

Incorporation of increasing amounts of a (meth)acrylic acid monomer in the (meth)acrylate copolymer produces a trend towards clearer adhesive coated sheets according to the present invention. Preferred acrylate copolymers include from 7.5 parts to 10 parts of acrylic acid to from 90 parts to 92.5 parts of a acrylate ester such as n-butyl acrylate. Haze measurements for adhesive coated sheets preferably fall below 5.0 when measured using a BYK-Gardner HAZE-GARD XL-211 haze measuring system (available from BYK-Gardner USA of Columbia, Md.). Observation of reduced haze indicates a relationship between the concentration of acrylic acid and compatibility of mixtures of acrylate polymers and urethane acrylate components, before and after exposing clear adhesive coated sheets to crosslinking radiation.

The acrylic acid component of the acrylate copolymer appears to affect both the haze and the adhesion of adhesive coated sheets according to the present invention. Adhesion for compositions containing copolymers of n-butyl acrylate and acrylic acid, before exposure to UV, decreases to a minimum for copolymers containing 95 parts of n-butyl acrylate to 5 parts of acrylic acid. Peel adhesions measured at 180° and a peel rate of 30.5 cm/min against silicon, using an Instrumentors Inc. peel/slip tester with a 9.0 kg maximum load cell, gave adhesion values, before exposure to UV radiation, from 200 gm/25 mm to 1000 gm/25 mm depending upon the concentration of urethane acrylate in an adhesive composition according to the present invention. Exposure to suitable radiation, including UV radiation lowers adhesion during crosslinking of the hexafunctional urethane acrylate oligomer. During this process the adhesion of the clear adhesive coated sheets drops into a range from 5 gm/25 mm to 50 gm/25 mm apparently regardless of the amount of urethane acrylate present.

Crosslinkers such as 1,1'-isophthaloylbis(2-methylaziridine) may be added to promote crosslinking of free acid groups to control modulus and improve the shear adhesion level of the adhesive before exposure to suitable radiation. There is no evidence to show that such crosslinkers have significant effect upon the haze characteristics of adhesive coated sheets according to the present invention.

Suitable materials for initiating free radical crosslinking to reduce adhesion include benzophenone, benzoin, benzoin ethers, acylphosphine oxides, thioxanthone derivatives, $\alpha,\alpha$, dialkoxyacetophenones, $\alpha$-hydroxy alkyl phenones and benzil ketals. Preferred initiators are commercially available as e.g. DAROCURE 1173, IRGACURE 184 and IRGACURE 651 (available from Ciba Specialty Chemicals Inc. of Tarrytown, N.Y.).

Solution adhesives may be coated onto suitable substrates by any variety of conventional coating techniques such as roll coating, spray coating, knife coating, and die coating. Also, any of these methods may be used to coat an adhesive composition onto a suitable release liner for transfer by lamination to a selected clear backing. Such a transfer coating method is preferred for manufacture of adhesive coated sheets according to the present invention.

Detackification of adhesive compositions, using ultraviolet radiation, according to the present invention may occur at elevated temperatures using a relatively thermally stable, free radical initiator. Thermally stable free radical initiators may be selected from substituted ketones including 1-benzoyl-cyclohexanol (IRGACURE 184). Suitable initiator selection overcomes inadvertent free radical generation by thermal degradation of an initiator or other components in an adhesive formulation. Such degradation could lead to premature detackification of adhesive compositions and potential loss of expensive microchips.

Thermally stable dhesive tapes according to the present invention preferably maintain expected levels of performance after exposure to a temperature of about 125° C. for about one hour. Suitable tape properties after such exposure include 180° peel adhesion values, measured against polished stainless steel, before exposure to ultraviolet radiation, from greater than about 300 gm/25 mm to about 2500 gm/25 mm. This level of adhesion assures retention and attachment of semiconductor wafers and over-molded chip strips and the like, to the surface of the wafer dicing tape, during testing and dicing. After exposure to ultraviolet radiation the tape should become detackified while retaining a desired level of transparency. Tape adhesion after detackification, measured using 180° peel from a stainless steel test surface, should be in the range of about 25 g/25 mm to less than about 300 g/25 mm preferably about 200 g/25 mm. Detackified tape should exhibit a low level of adhesion in the desired range during exposure to temperatures up to about 150° C. for six hours.

The current invention depends on polymerization of low molecular weight oligomers triggered by exposure to UV. Shrinkage and loss of plasticizing effect associated with polymerization cause detackification.

Experimental

Polymer Preparation

Each of the polymer compositions A-E (Table 1) were prepared by placing 200 g of the appropriate monomer mixture dissolved in 300 g of acetone in a quart jar. Thereafter 0.5 g azo-bis(isobutyronitrile) (VAZO 64 from duPont de Nemours and Co.) was added as a free radical initiator. Each formulation was purged by bubbling nitrogen through the solution for 5 minutes at a rate of 2 L/min. Reaction of the monomers occurred over a period of 20 hours during which sealed containers were agitated in a water bath at a temperature of 55° C.

TABLE 1

Compositions of Acrylate Polymers

| Polymer | Butyl acrylate (BA) | Acrylic Acid (AA) | Monomer Ratio |
|---|---|---|---|
| A | 200 | 0 | BA/AA - 100/0 |
| B | 198 | 2 | BA/AA - 99/1 |
| C | 195 | 5 | BA/AA - 97.5/2.5 |
| D | 190 | 10 | BA/AA - 95/5 |
| E | 180 | 20 | BA/AA - 90/10 |

Preparation of Adhesives and Low Haze Adhesive Coated Sheets

Adhesive compositions, prepared as solutions in acetone, comprise an acrylate copolymer of an acrylate ester and acrylic acid having an inherent viscosity from 1.5 to 1.6 corresponding to a molecular weight of about 400,000, mixed with a multi-functional aliphatic or aromatic urethane acrylate. Preferably the acrylate copolymer is formed by free radical polymerization of n-butyl acrylate and acrylic acid monomers present at a level of 30 wt. % in acetone. Varying amounts of a 30% solution of a urethane acrylate in acetone were added to the resulting copolymer solution. Other adhesive components including acetone soluble photoinitiators, such as DAROCUR 1173 (available from Ciba Specialty Chemicals Inc.) and crosslinkers such as 1,1'-isophthaloylbis(2-methylaziridine), were added to the solution just before coating. Following addition of the solute materials, the solids content of the solutions was adjusted to 25 wt. % with acetone and the resulting coating composition was mixed thoroughly.

Adhesive coated material was prepared by knife coating with a knife gap of 125 $\mu$m to provide a layer of an adhesive solution, 25 wt. % in acetone, onto a silicone-coated surface of a polyethyleneterephthalate film. Drying the coating in an oven at 110° C. for ten minutes produced an adhesive coating 25 $\mu$m thick. Adhesive coated film sheets, according to the present invention, were then produced by transfer of the adhesive layer to a 50 $\mu$m thick extruded film of SURLYN ionomer (available from du Pont de Nemours and Company) during lamination of the ionomer film with the adhesive coated polyethyleneterephthalate release liner.

Compositions of the dried adhesive coatings are included in Tables 2–4 along with properties of adhesive sheets according to the present invention showing changes in haze and adhesion characteristics before and after exposure to approximately 300 mJ/cm$^2$ of ultraviolet radiation using a medium pressure mercury arc lamp.

Table 5 provides adhesive compositions suitable for use at elevated temperatures. Irgacure 184 (1-benzoylcyclohexanol available from Ciba Specialty Chemicals Inc. of Tarrytown, N.Y.) is a preferred initiator for these compositions. Thermally stable, adhesive coated film sheets, according to the present invention, were coated on pretreated polyethylene terephthalate film, 100 microns (0.004 inch) thick. Adhesion test results varied depending on the particular pretreatment used to provide a primed substrate.

Preparation of Primed Polyester Substrate

The selection of processing techniques or chemical compositions for priming polyethylene terephthalate films 100 microns (0.004 inch) thick had a significant effect upon adhesive performance and retention of the adhesive (e.g. Example 21) by the substrate itself. Table 6 indicates the priming effect of corona treatment and a variety of priming compositions.

Primer compositions containing about 0.01% to about 0.10% of CX-100, (available as NEOCRYL CX-100 polyfunctional aziridine crosslinker from NeoResins of Wilmington, Mass. in MEK gave very low coating weights when applied using a foam brush to provide a just-visible continuous liquid layer on the surface of the film (see compositions P1 to P5). Coated films were dried at 110° C. for five minutes. Increasing the concentration of CX-100 above 0.10% leads to adhesive failure (see composition P6) even at room temperature. The cause of failure appears to be an excess of CX-100 that promotes adhesive crosslinking, and premature detackification.

Corona treatment prior to coating improves the surface energy of polyethylene terephthalate film. Treated film 100 microns (0.004 inch) thick had over 60 dynes/cm surface energy. Without application of primer compositions, a corona treated, polyethylene terephthalate film, coated with adhesive, showed adhesive bond failure between adhesive and backing.

Test Methods

Inherent Viscosity of Polymers

Inherent viscosity (IV) measurements were made for ethyl acetate solutions of n-butyl acrylate homopolymers and copolymers containing up to 15 wt. % of acrylic acid. Solution concentration was 0.2 g of polymer per 100 ml of ethyl acetate. Measurement results included IV values from about 1.528 to about 1.590.

Haze

Haze characteristics of UV detackifiable adhesive sheets were measured, before and after exposure to UV. Standard test methods ASTM D-1003, using a BYK-Gardner HAZE-GARD XL-211 System, are suitable for this purpose. Preferably the substrate is SURLYN ionomer film, 50 $\mu$M thick, having a haze value of less than about 2.0, unless wafer processing involves elevated temperatures. A dimensionally stable film such as polyethylene terephthalate or polyethylene naphthalate represents a preferred film for elevated temperature use.

Peel Adhesion

Adhesives of Examples 1–18 were coated on to 50 $\mu$m thick SURLYN ionomer film followed by conversion into 25 mm wide strips of adhesive tape. Samples of tape were applied and bonded to polished silicon wafers using the weight of a 2Kg roller over the length of the tape applied to the wafer. Enough tape extended over the edges of the wafer to perform 180° peel evaluation of individual samples mounted horizontally on the base of a slip/peel adhesion tester available from Instrumentors Inc. Peel adhesion was tested for 10 seconds at a peel rate of 300 mm/min rate relative to a 9.0 kg maximum load cell. The average of three readings was reported.

After measurement of their initial tack, adhesive coated tapes were detackified by passing a sample of tape, bonded to a silicon wafer, under a medium pressure mercury arc lamp for a radiation dose of 300 mJ/cm$^2$ to 500 mJ/cm$^2$. The 180° peel adhesion described above was repeated after exposure to determine the lowering of adhesion attributable to UV exposure.

The information in Tables 2–4 provides evidence of property changes associated with the concentration of urethane acrylate and the concentration of acrylic acid component in compositions according to the present invention. Increasing amounts of urethane acrylate in the coated and dried adhesive compositions cause a noticeable lowering of initial adhesion levels. However, after exposure to radiation, adhesion levels drop to a range from 5 g/25 mm to 25 g/25 mm without clear evidence of influence by a specific component of the coating.

Regardless of the influence of urethane acrylate oligomer on the properties of clear adhesive coated sheets, an important feature of the present invention is the improvement in haze, to lower values, with increasing concentration of the (meth)acrylic acid component of the (meth)acrylate polymer. According to available examples the copolymer exhibits at least eighty percent less haze than the homopolymer. Further, in preferred compositions, the haze value changes little after exposure to radiation to lower adhesion.

Peel adhesion for Examples 19–24 and P1–P7 used samples coated on to corona treated and primed polyethylene terephthalate film, 100 microns (0.004 inch) thick, followed by conversion into 25 mm wide strips of adhesive tape. Samples of tape were applied and bonded to polished stainless steel using the weight of a 2Kg roller over the length of the tape applied to the stainless steel plate. Enough tape extended over the edges of the plate to perform 180° peel evaluation of individual samples mounted horizontally on the base of a slip/peel adhesion tester available from Instrumentors Inc. Peel adhesion was tested for 10 seconds at a peel rate of 300 mm/min relative to a 9.0 kg maximum load cell. The average of three readings was reported.

After measurement of their initial tack, adhesive coated tapes of Examples 19–24 and P1–P7 were detackified according to Conditions A–H (see page 21). Samples were exposed to ultraviolet radiation of about 400 mJ/cm$^2$. Variation of tape adhesion could be achieved by changing the level of crosslinkable urethane acrylate oligomer, or by selecting the exposure level (mJ/cm$^2$) or by adjusting adhesive layer thickness.

TABLE 2

Composition* and Results for Examples 1–6

| Example | 1 | 2 | 3 | 4 | 5 | 6 |
|---|---|---|---|---|---|---|
| Acrylate Copolymer BA/AA | | | | | | |
| 100/0 | 100 | | | | | |
| 99/1 | | 100 | | | | |
| 97.5/2.5 | | | 100 | | | |
| 95/5 | | | | 100 | | |
| 92.5/7.5 | | | | | 100 | |
| 90/10 | | | | | | 100 |
| CN 975 | 30 | 30 | 30 | 30 | 30 | 30 |
| Initiator | 1.5 | 1.5 | 1.5 | 1.5 | 1.5 | 1.5 |
| Crosslinker | 0.15 | 0.15 | 0.15 | 0.15 | 0.15 | 0.15 |
| Initial Haze | 13.2 | 12.4 | 7.7 | 4.6 | 3.0 | 2.2 |
| Final Haze | 19.0 | 15.3 | 11.8 | 5.9 | 3.5 | 3.5 |
| Initial Adhesion gm/25 mm | 310 | 250 | 245 | 225 | 430 | 400 |
| Final Adhesion gm/25 mm | 6 | 6 | 11 | 11 | 24 | 6 |

*The composition is given in parts per one hundred parts of acrylate copolymer after removal of solvent.

TABLE 3

Composition and Results for Examples 7–12

| Example | 7 | 8 | 9 | 10 | 11 | 12 |
|---|---|---|---|---|---|---|
| Acrylate Copolymer BA/AA | | | | | | |
| 100/0 | 100 | | | | | |
| 99/1 | | 100 | | | | |
| 97.5/2.5 | | | 100 | | | |
| 95/5 | | | | 100 | | |
| 92.5/7.5 | | | | | 100 | |
| 90/10 | | | | | | 100 |
| CN 975 | 35 | 35 | 35 | 35 | 35 | 35 |
| Initiator | 1.75 | 1.75 | 1.75 | 1.75 | 1.75 | 1.75 |
| Crosslinker | 0.15 | 0.15 | 0.15 | 0.15 | 0.15 | 0.15 |
| Initial Haze | 15.9 | 13.5 | 10.6 | 4.2 | 3.8 | 2.7 |
| Final Haze | 22.7 | 17.2 | 14.3 | 6.2 | 4.3 | 3.8 |
| Initial Adhesion gm/25 mm | 280 | 235 | 245 | 225 | 290 | 400 |
| Final Adhesion gm/25 mm | 6 | 11 | 6 | 11 | 6 | 6 |

TABLE 4

Composition and Results for Examples 13–18

| Example | 13 | 14 | 15 | 16 | 17 | 18 |
|---|---|---|---|---|---|---|
| Acrylate Copolymer BA/AA | | | | | | |
| 100/0 | 100 | | | | | |
| 99/1 | | 100 | | | | |
| 97.5/2.5 | | | 100 | | | |
| 95/5 | | | | 100 | | |
| 92.5/7.5 | | | | | 100 | |
| 90/10 | | | | | | 100 |
| CN 975 | 40 | 40 | 40 | 40 | 40 | 40 |
| Initiator | 2.0 | 2.0 | 2.0 | 2.0 | 2.0 | 2.0 |
| Crosslinker | 0.15 | 0.15 | 0.15 | 0.15 | 0.15 | 0.15 |
| Initial Haze | 19.8 | 17.0 | 11.6 | 6.4 | 5.8 | 2.5 |
| Final Haze | 31.2 | 23.2 | 16.6 | 6.9 | 7.5 | 3.5 |
| Initial Adhesion gm/25 mm | 240 | 230 | 220 | 185 | 275 | 370 |
| Final Adhesion gm/25 mm | 6 | 25 | <5 | 6 | 21 | 6 |

TABLE 5

Compositions and Results for Examples 19–24

| Example | 19 | 20 | 21 | 22 | 23 | 24 |
|---|---|---|---|---|---|---|
| Acrylate Polymer 92.5BA/7.5AA | 100 | 100 | 100 | 100 | 100 | 100 |
| CN 975 | 25 | 30 | 35 | 35 | 35 | 40 |
| Initiator | 1.25 | 1.5 | 1.75 | 1.75 | 1.75 | 2.0 |
| Crosslinker | 0.187 | 0.195 | 0.202 | 0.202 | 0.202 | 0.210 |
| Adhesive layer thickness microns (mil) | 20 (0.8) | 20 (0.8) | 20 (0.8) | 12.5 (0.5) | 5 (0.2) | 20 (0.8) |

| Results of Testing | Peel Adhesion to Stainless Steel (gm/25 mm) with *conditions shown | | | | | |
|---|---|---|---|---|---|---|
| Condition A | 772 | 914 | 857 | 314 | 46 | 571 |
| Condition B | 743 | 1000 | 857 | 343 | 28 | 717 |
| Condition C | 2428 | 1714 | 1742 | 857 | 85 | 2000 |
| Condition D | 628 | 85 | 85 | 28 | 28 | 72 |
| Condition E | 2142 | 1343 | 200 | 280 | 229 | 343 |
| Condition F | 1657 | 571 | 129 | — | — | 114 |
| Condition G | 1857 | 268 | 177 | 43 | 62 | 487 |
| Condition H | 1571 | 172 | 85 | — | — | 129 |

Sample Conditioning for Adhesion Measurement
Condition A: Three hours at room temperature.
Condition B: Twenty four hours at room temperature
Condition C One hour at 125° C.
Condition D Condition B followed by exposure to ultraviolet radiation
Condition E Condition C followed by exposure to ultraviolet radiation
Condition F Condition B followed by a second exposure to ultraviolet radiation
Condition G Condition B followed by heating at 150° C. for six hours
Condition H Condition F followed by heating at 150° C. for six hours

TABLE 6

Primer Compositions and Adhesive Test Results Using Example 21

| Peel Adhesion to Stainless Steel (gm/25 mm)* | P1 | P2 | P3 | P4 | P5 | P6 | P7 |
|---|---|---|---|---|---|---|---|
| Condition A | 514 | 449 | 371 | 228 | 85 | 57 | 571 |
| Condition B | 657 | 428 | 314 | 257 | 72 | | |
| Condition C | 743 | 943 | 343 | 200 | 142 | | |
| Condition D | 28 | 28 | 28 | 57 | 28 | | |
| Condition E | 57 | 57 | 57 | 57 | 85 | 43 | 57 |
| Condition G | 171 | 171 | 142 | 85 | 171 | 43 | 100 |

*NOTE Tests were performed one day after sample preparation using corona treated polyethylene terephthalate film 100 microns (0.004 inch) thick.
Primer Compositions
P1—0.01 wt% CX-100 in MEK
P2—0.05 wt% CX-100 in MEK
P3—0.1 wt% CX-100 in MEK
P4—0.2 wt% CX-100 in MEK
P5—0.5 wt% CX-100 in MEK
P6—Corona treatment of PET film 1 mm thick coated with 2 wt% CX-100 in MEK
P7—Corona treated PET film, 1 mm thick Adhesive compositions suitable for coating on transparent substrates to provide radiation detackifiable wafer-dicing adhesive sheets exhibiting relatively high initial adhesion and low haze have been described according to the present invention. It will be appreciated by those of skill in the art that, in light of the present disclosure, changes may be made to the embodiments disclosed herein without departing from the spirit and scope of the invention.

What is claimed is:

1. A radiation detackifiable, thermally stable adhesive composition comprising:
    a (meth)acrylate copolymer comprising from 85 wt. % to 97.5 wt. % of a (meth)acrylate ester and from 2.5 wt. % to 15 wt. % of a copolymerizable carboxylate monomer;
    a multi-functional urethane acrylate oligomer combined with said (meth)acrylate copolymer to provide from 25 parts to 40 parts by weight of said oligomer per 100 parts by weight of said copolymer; and
    a thermally stable free radical initiator to conserve adhesive properties at temperatures from about 115° C. to about 155° C., said adhesive composition becoming progressively detackified during exposure to ultraviolet radiation.

2. A radiation detackifiable, thermally stable adhesive according to claim 1, wherein said thermally stable free radical initiator comprises 1-benzoyl cyclohexanol.

3. A radiation detackifiable, thermally stable adhesive composition according to claim 1, wherein said (meth)acrylate ester is selected from the group consisting of methyl acrylate, ethyl acrylate, propyl acrylate, n-butyl acrylate, isobutyl acrylate, 2-methylbutyl acrylate, 2-ethylhexyl acrylate, 2-ethylhexyl methacrylate, n-octyl acrylate, n-octyl methacrylate, isooctyl acrylate, isooctyl methacrylate, isononyl acrylate, isodecyl acrylate, isobornyl acrylate, vinyl acetate and mixtures thereof.

4. A radiation detackifiable, thermally stable adhesive composition according to claim 1, wherein said copolymerizable carboxylate monomer is selected from the group consisting of acrylic acid, methacrylic acid, beta-carboxyethyl acrylate, itaconic acid, crotonic acid, and fumaric acid.

5. A radiation detackifiable, thermally stable adhesive composition according to claim 1, wherein said multi-functional urethane acrylate is an aliphatic urethane acrylate oligomer.

6. A radiation detackifiable, thermally stable adhesive composition according to claim 1, wherein said multi-functional urethane acrylate is an aromatic urethane acrylate oligomer.

7. A radiation detackifiable, thermally stable adhesive composition according to claim 6, wherein said multi-functional urethane acrylate is a hexafunctional aromatic urethane acrylate oligomer.

8. A clear adhesive coated sheet for supporting a silicon wafer during manufacture of semiconductor micro-chips at elevated temperature, said coated sheet comprising:
    a transparent film substrate having coated thereon
    a radiation detackifiable, thermally stable adhesive composition comprising:
    a (meth)acrylate copolymer comprising from 85 wt. % to 97.5 wt. % of a (meth)acrylate ester and from 2.5 wt. % to 15 wt. % of a copolymerizable carboxylate monomer;
    a multi-functional urethane acrylate oligomer combined with said (meth)acrylate copolymer to provide from 25 parts to 40 parts by weight of said oligomer per 100 parts by weight of said copolymer; and
    a thermally stable free radical initiator to conserve adhesive properties at temperatures from about 115° C. to about 155° C., said adhesive composition becoming progressively detackified during exposure to ultraviolet radiation.

9. A clear adhesive coated sheet according to claim 8, wherein said thermally stable free radical initiator comprises 1-benzoylcyclohexanol.

10. A clear adhesive coated sheet according to claim 8, wherein said adhesive sheet has an initial 180° peel adhesion from stainless steel from about 200 g/25 mm to about 2,500 g/25 mm, said 180° peel adhesion falling to between about 25 g/25 mm to about 300 g/25 mm after exposure of said coated sheet to about 400 mJ/cm$^2$ radiation from a medium pressure mercury arc lamp said coated sheet having a haze level of less than 8, before and after exposure to radiation, as measured using a BYK Gardner HAZEGARD XL-211 tester.

11. A clear adhesive coated sheet according to claim 10, wherein said adhesive sheet has an initial 180° peel adhesion from stainless steel from about 200 g/25 mm to about 2,500 g/25 mm, said 180° peel adhesion falling to between about 25 g/25 mm and about 200 g/25 mm after exposure of said coated sheet to about 400 mJ/cm$^2$ radiation from a medium pressure mercury arc lamp.

12. A clear adhesive coated sheet according to claim 8, wherein said (meth)acrylate ester is selected from the group consisting of methyl acrylate, ethyl acrylate, propyl acrylate, n-butyl acrylate, isobutyl acrylate, 2-methylbutyl acrylate, 2-ethylhexyl acrylate, 2-ethylhexyl methacrylate, n-octyl acrylate, n-octyl methacrylate, isooctyl acrylate, isooctyl methacrylate, isononyl acrylate, isodecyl acrylate, isobornyl acrylate, vinyl acetate and mixtures thereof.

13. A clear adhesive coated sheet according to claim 8, wherein said copolymerizable carboxylate monomer is selected from the group consisting of acrylic acid, methacrylic acid, beta-carboxyethyl acrylate, itaconic acid, crotonic acid, and fumaric acid.

14. A clear adhesive coated sheet according to claim 8, wherein said multi-functional urethane acrylate is an aliphatic urethane acrylate oligomer.

15. A clear adhesive coated sheet according to claim 8, wherein said multi-functional urethane acrylate is an aromatic urethane acrylate oligomer.

16. A clear adhesive coated sheet according to claim 15, wherein said multi-functional urethane acrylate is hexafunctional aromatic urethane acrylate oligomer.

* * * * *

UNITED STATES PATENT AND TRADEMARK OFFICE
CERTIFICATE OF CORRECTION

PATENT NO.        : 6,759,121 B2
APPLICATION NO.   : 10/015006
DATED             : July 6, 2004
INVENTOR(S)       : Karunasena A. Alahapperuma It is certified that error appears in the above-identified patent and that said Letters Patent is hereby corrected as shown below:

Column 7,
Line 22, delete "isobomyl" and insert in place thereof -- i s o b o r o n y l -- .

Column 11,
Line 9, insert -- ) -- following "Mass".

Column 14,
Table 5, Footnote, Line 7, delete "Condition F  Condition B" and insert in place thereof -- Condition F Condition E --.
Table 5, Footnote, Line 8, delete "Condition G  Condition B" and insert in place thereof -- Condition G Condition E --.

Signed and Sealed this

Ninth Day of January, 2007

JON W. DUDAS
*Director of the United States Patent and Trademark Office*